(12) United States Patent
Farooq et al.

(10) Patent No.: US 6,200,400 B1
(45) Date of Patent: Mar. 13, 2001

(54) METHOD FOR MAKING HIGH K DIELECTRIC MATERIAL WITH LOW K DIELECTRIC SHEATHED SIGNAL VIAS

(75) Inventors: Mukta S. Farooq, Hopewell Junction; Harvey C. Hamel, Poughkeepsie; Robert A. Rita; Herbert I. Stoller, both of Wappingers Falls, all of NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/465,134

(22) Filed: Dec. 16, 1999

Related U.S. Application Data

(62) Division of application No. 09/007,624, filed on Jan. 15, 1998, now Pat. No. 6,072,690.

(51) Int. Cl.[7] .......................... B32B 31/26; B32B 31/18; H01G 4/06
(52) U.S. Cl. ..................... 156/89.16; 156/89.12; 156/252; 156/253; 156/261; 156/293; 361/321.2
(58) Field of Search ............... 156/89.12, 89.14, 156/89.16, 250, 252, 261, 293, 253; 361/321.2

(56) References Cited

U.S. PATENT DOCUMENTS

| 4,349,862 | 9/1982 | Bajorek et al. . |
|---|---|---|
| 4,567,542 | 1/1986 | Shimada et al. . |
| 4,757,235 | 7/1988 | Nunomura et al. . |
| 4,935,844 | 6/1990 | Burn . |
| 5,144,526 | 9/1992 | Vu et al. . |
| 5,162,977 | 11/1992 | Paurus et al. . |
| 5,177,670 | 1/1993 | Shinohara et al. . |
| 5,371,403 | 12/1994 | Huang et al. . |
| 5,378,662 | 1/1995 | Tsuyuki . |
| 5,400,210 | 3/1995 | Sugimoto et al. . |
| 6,072,690 | * 6/2000 | Farooq et al. ............ 361/321.2 |

FOREIGN PATENT DOCUMENTS 4-25098 * 1/1992 (JP) .

OTHER PUBLICATIONS

"Low Capacitive Via Path Through High Dielectric Constant Material," IBM Technical Disclosure Bulletin, vol. 22, issue 12, pp. 5330–5331 (Abstract only), May 1980.*

* cited by examiner

Primary Examiner—Curtis Mayes
(74) Attorney, Agent, or Firm—Ratner & Prestia; Tiffany L. Townsend, Esq.

(57) ABSTRACT

A multi-layer ceramic capacitor and method of manufacturing the capacitor, the capacitor having signal vias surrounded by an area containing a material having a low dielectric constant, the via and surrounding area of low dielectric constant material inserted in a material having a high dielectric constant.

8 Claims, 9 Drawing Sheets

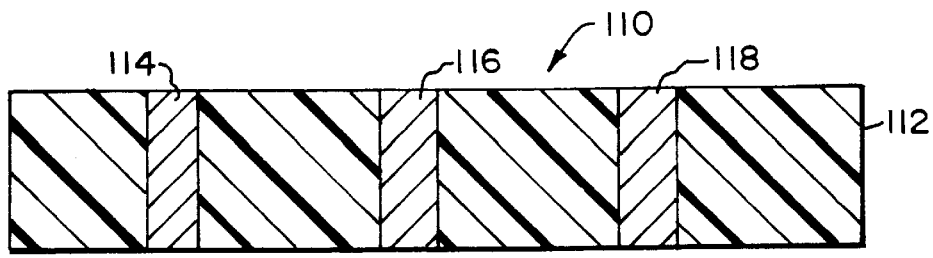
FIG. 6A
FIG. 6B
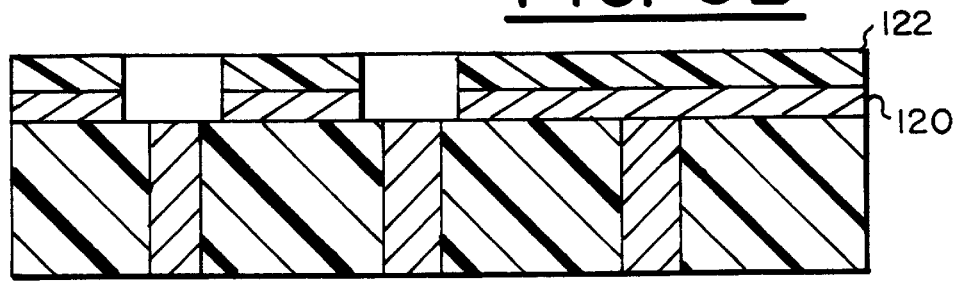
FIG. 6C
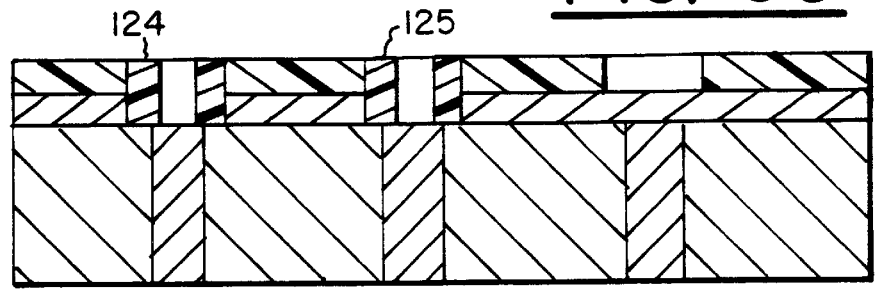
FIG. 6D
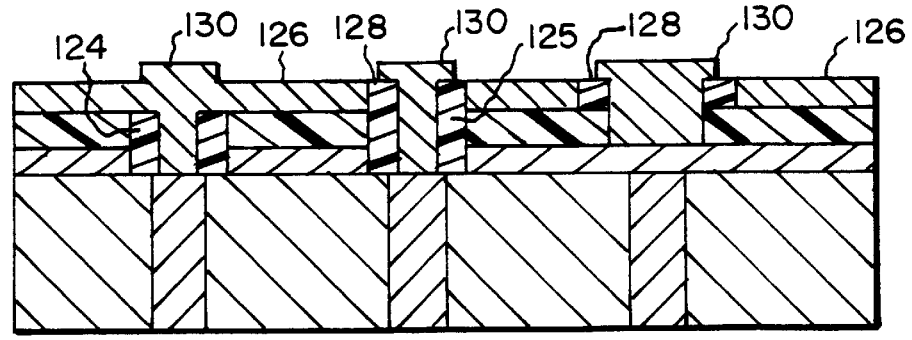

METHOD FOR MAKING HIGH K DIELECTRIC MATERIAL WITH LOW K DIELECTRIC SHEATHED SIGNAL VIAS

This application is a division of U.S. patent application Ser. No. 09/007,624, filed on Jan. 15, 1998, now U.S. pat. No. 6,072,690, Jun. 6, 2000.

FIELD OF THE INVENTION

The present invention relates in general to multilayer ceramic capacitors. In particular, the present invention describes a multilayer ceramic capacitor with low dielectric constant material in-the vicinity of signal vias. The present invention also pertains to an interposer between a semiconductor chip and the chip carrier.

BACKGROUND OF THE INVENTION

Multilayer ceramic capacitors for decoupling applications require the use of high k (dielectric constant) dielectric to provide the necessary capacitance. However, for high performance applications, in an interposer configuration, this high dielectric capacitance between signal vias can cause excessive parasitic capacitance/noise, thus detracting from the performance of the decoupling capacitor or"decap". Therefore, while a high k ceramic is required for the capacitor, it is a detriment in the immediate vicinity of signal vias.

Multilayer ceramic (MLC) capacitors are frequently used to suppress the voltage noise generated by circuits in semiconductor chips. This noise arises as a result of voltage fluctuations generated across power bus lines during the simultaneous switching of circuits. This noise can degrade chip performance. Further, as circuit densities increase and rise times decrease, and supply voltage levels decrease, the simultaneous switching problem gets exacerbated. This can seriously impede chip performance at high frequencies of operation.

Decoupling capacitors are used as a means to reduce the extent of this problem. Typical low inductance MLC discrete decaps are made using relatively high permittivity ceramic materials which enable the delivery of high capacitance. These may be made in the parallel plate configuration with a plurality of termination points on either side which act as the two electrodes, which may be then connected to power and ground respectively. Such low inductance decaps can provide 30 to 200 nF per discrete MLC capacitor of less than 2 mm×2 mm×2 mm size. However the inductance associated with these discrete decaps is still too high to handle high frequency, high power, chip requirements.

The ideal location for decoupling capacitance is between the chip and the power supply system, on its carrier. An interposer decap or an integrated capacitor structure are both ways of achieving this ideal location. The main problem with this type of capacitor structure is that signal traces must also pass through high permittivity layers. This can contribute to unacceptably high signal to signal coupling or signal capacitance.

In an ideal capacitor structure, signals should move through low permittivity regions, while voltage and ground transmissions can move through areas of high permittivity. Such a structure enables decoupling capacitance to be delivered at the required site without the excess load of high parasitic capacitance and signal to signal coupling which might arise if signal transmission were to occur through regions of high electrical permittivity.

As semiconductor logic chips improved in performance by decreasing the cycle time and hence increasing the execution rate, it became desirable to incorporate decoupling capacitors into the circuit to reduce the effect of the noise generated at, these increased switching rates and to otherwise improve overall performance. Initially these decoupling capacitors were constructed using discrete components and were mounted on a convenient location of the ceramic substrate or printed circuit board to which the chips were attached. However, as chip performance continued to improve, it became advantageous to provide low inductance paths between the capacitors and the chips.

Arnold et al. describe a low inductance electrode design for discrete capacitors in U.S. Pat. No. 4,831,494. These discrete capacitors would preferably be mounted as close to the chips as possible, on areas of the substrate adjacent to the chips for example, to further limit inductance and otherwise improve performance.

In U.S. Pat. No. 4,800,459, Takagi et al. suggest placement of discrete capacitors in substrate cavities under the chip site.

Bajorek et al. (U.S. Pat. Nos. 4,328,530 & 4,349,862) also suggested placing the decoupling capacitors in the ceramic substrate under the chip sites, but their design integrates the capacitor structures into the construction of the substrate. That is, specific regions of the ceramic multilayer structure are constructed using high dielectric constant materials and electrodes are placed on opposing sides of the high dielectric constant material to form capacitors. Bajorek, et al. also suggested that these integrated capacitors utilize specially designed low inductance electrode geometries.

Placement under the chip is the preferred location for the decoupling capacitors as it provides the shortest electrical path. Under-the-chip integrated capacitors have been described for ceramic substrate applications where the chips are wire bond connected to electrical connection pads on the substrate (U.S. Pat. Nos. 5,099,388, 5,521,332 & 5,371,403) . The chips can be attached to the flat upper surface or within cavities. For substrates where chip attach is by C4 or flip-chip solder attach and the signal and power I/O (pins, ball or column grid, land grid, etc.) are on the other side; under-the-chip integrated capacitors can also be constructed.

Bajorek, et al. (U.S. Pat. Nos. 4,328,530 & 4,349,862) demonstrated capacitor placement in the ceramic multilayer substrate (which could also have thin-film wiring on the chip side surface), as did Hiroichi, et al. (U.S. Pat. Nos. 5,177, 670).

Alternately the under-the-chip integrated capacitors can be constructed within thin-film layers on the chip side surface of the MLC substrate as described by Chance, et al. in U.S. Pat. No. 5,177,594 and Hiroichi, et al. in U.S. Pat. No. 5,177,670.

With today's extremely fast chips it is not only important to place the integrated capacitors very close to the chips with low inductance connecting paths, but to also insure that the signal wiring passes through low dielectric constant materials. With many wire bond designs, the chip and substrate I/O are on the same side of the ceramic substrate and high dielectric constant integrated capacitor layers can be placed under the chip without contacting the signal lines, as in U.S. Pat. Nos. 5,099,388 & 5,521,332. But even some wire-bond substrate designs are preferably constructed with low dielectric layers next to the chip to minimize degrading signal line performance (U.S. Pat. 5,371,403). However, with multilayer ceramic substrates (with or without thin-film layers-) where chip connection is by C4 or flip-chip type connections, it is usually not possible to construct the substrates with layers completely consisting of high dielectric constant material(s) without having the signal lines undesirably passing through the high dielectric material. It is therefore preferable to construct capacitor containing layers using both high and low dielectric constant materials such as described in U.S. Pat. No. 5,177,670.

FIG. 1 shows the general arrangement of an interposer capacitor 10. In this figure the chip 14 is attached to the interposer 16 by standard flip chip techniques which are well known in the industry, i.e. C4 bonding as illustrated by circles 15. The interposer 16 is in turn connected using connections 17 to the carrier 18 using similar technology. Both signal and voltage connections are made from chip 14 to interposer 16 and from interposer 16 to carrier 18. Items identified as 19 are module IO, and connectors such as pins, solder, balls,etc.

FIG. 2a shows a conventional interposer capacitor 20. FIG. 2a shows a multilayer structure (a possible embodiment could be using ceramic layers) having dielectric layers 21, 22, 23. In one embodiment layers 21,22,23 are made of a high k material to enhance the value of the capacitance between metal electrodes 27 and 28. Passing through this structure are signal vias 25. Also passing through the dielectric layers are voltage vias 24 and 26 which are also connected to the electrodes 27 and 28 respectively. In a conventional structure the signal vias 25 would thus be in intimate contact with the high k material layers 22. To facilitate its use as an interposer, the structure 20 has pads 29 on its top surface to provide connection to a chip which could use, for example, conventional flip-chip or C4 bonding. There are also pads 30 on the bottom surface to facilitate connection to the chip carrier, either a single chip or multi-chip carrier.

FIG. 2b shows a conventional carrier-integrated capacitor 40. FIG. 2b) shows a multilayer structure (a possible embodiment could be using ceramic layers) having dielectric layers 41, 42, 43, 44. In one embodiment layers 42 are made of high k material to enhance the value of the capacitance between metal electrodes 47 and 48, while layers 41, 43 and 44 could be of low k material. Passing through this structure are signal vias 45. In a conventional structure the signal vias 45 would thus be in intimate contact with the high K material of layers 42. This would add significant capacitance and coupling parasitics to the device. Also passing through the dielectric layers are voltage vias 51 and 46 which are also connected to the top most electrodes 47 and 48 respectively. Voltage vias 51 and 46 may also be connected to other metal layers (47 and 48 respectively) in the carrier. The carrier would have, as is currently practiced, pads 49 on its top surface to provide connection to a chip which could use for example flip-chip or C4 technology. There are also pads 50 on the bottom surface to facilitate connection to the next level carrier, i.e. a card or a board. Again, the carrier could be a single chip carrier or a multi-chip carrier.

SUMMARY OF THE INVENTION

In one aspect the present invention is a multilayer ceramic capacitor with signal vias surrounded by an area containing low dielectric constant material disposed in a material having a high dielectric contstant in the capacitor, the resulting capacitor having a high capacitance, low inductance structure ideal for use as a decoupling device for high performance semiconductor chips. The multilayer ceramic capacitor can be interposed between a high performance semiconductor chip and a single or a multi-chip carrier. This structure can be formed as an integral part of a single chip carrier or a multi-chip carrier.

In another aspect the present invention is a method for producing a metal via surrounded by a material of low dielectric constant, the via and the low dielectric constant material embedded in a material having a high dielectric constant, the method effected by forming a via or vias having a predetermined diameter in a green sheet material having a low dielectric constant, thereafter filling the via(s) with a selected metal paste followed by drying of the sheet. A second green sheet material having a high dielectric constant is selected and an aperture(s) having a diameter that is equal to the diameter of the via(s) plus the width of the surrounding low dielectric constant material desired in the finish structure is/are formed in the second green sheet. The sheet of low dielectric constant material is placed above the second sheet of high dielectric constant material so that the axes of the via(s) and the aperture(s) are co-axially aligned. Then a punch having a diameter equal to that of the aperture(s) is placed with the center line in co-axial alignment with the center line of the via(s) and aperture(s) and a plug is removed from the low dielectric constant green sheet and inserted into the aperture is the second green sheet. According to the method of the invention several sheets of high dielectric material with inserted vias surrounded by a material of low dielectric constant can be produced. The sheets can be stacked to produce a multi-layer structure with a continuous via from a top to a bottom surface of the multi-layered structure. The layers can be laminated and then the laminated assembly sintered.

The foregoing and other aspects of the present invention will become apparent from the following detailed description of the invention when considered in conjunction with the accompanying drawing.

BRIEF DESCRIPTION OF THE DRAWING

FIGS. 6a through 6d illustrated a method for constructing a post-fire capacitor with multiple vias.

DESCRIPTION OF EXEMPLARY EMBODIMENTS AND BEST MODE

The structure of the proposed invention is shown in the following figures.

Figure 1:
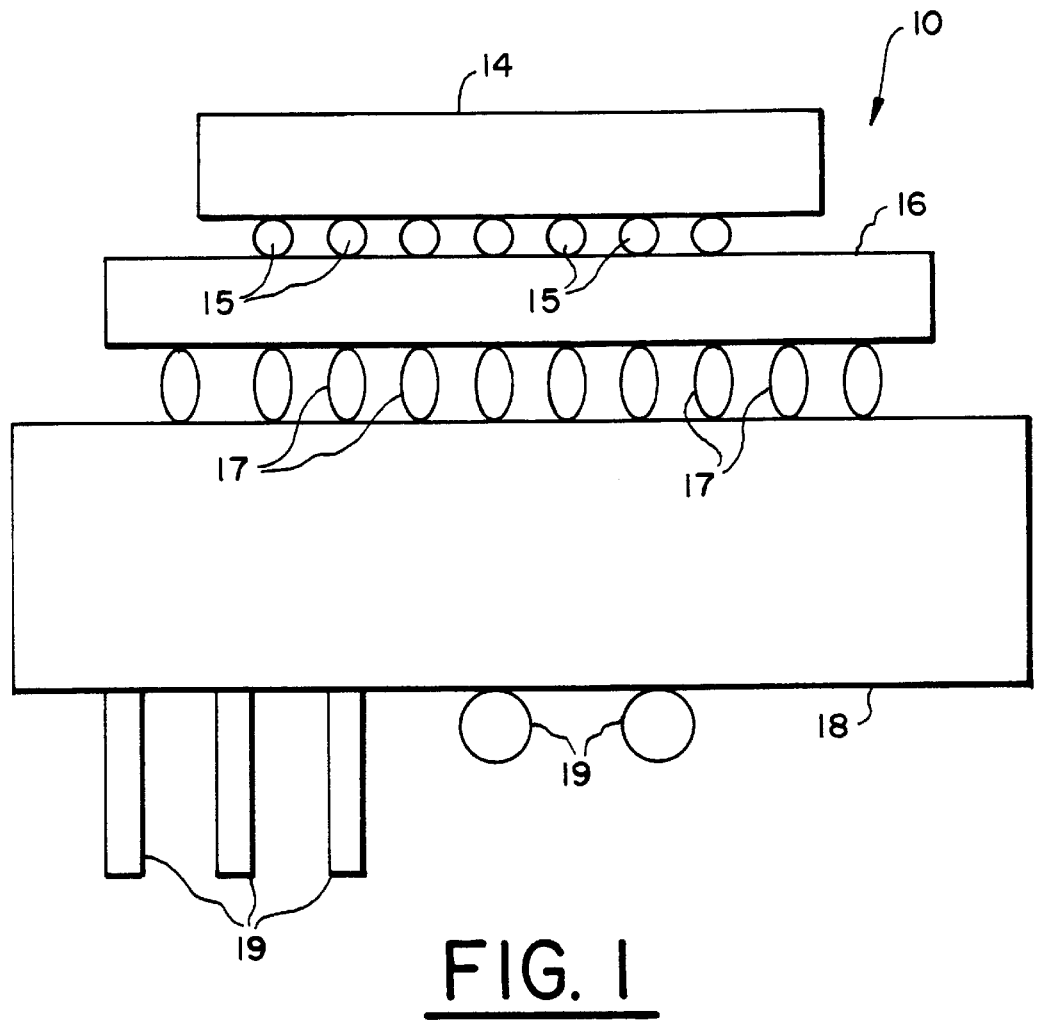
FIG. 1 is a schematic diagram generally illustrating the placement of an interposer capacitor.
Figure 2A:
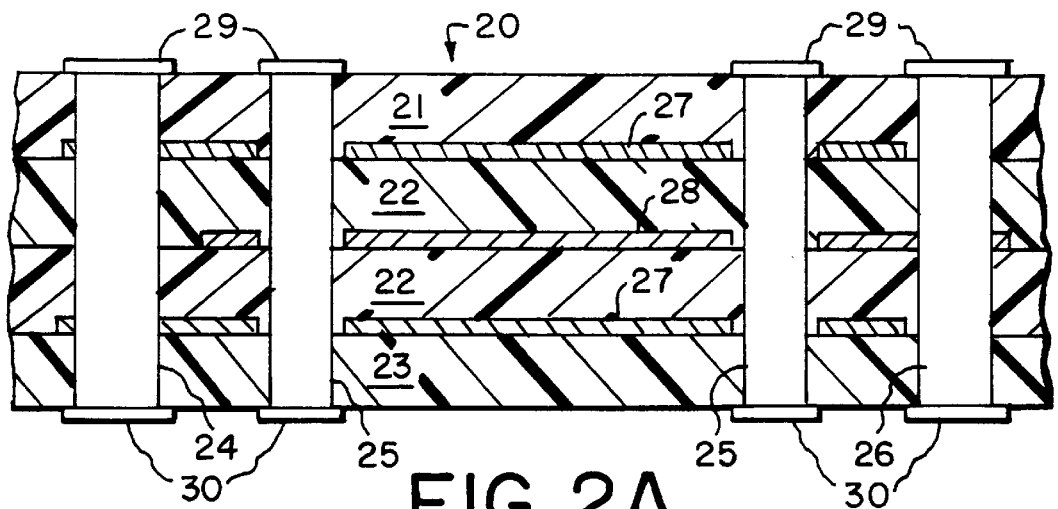
FIG. 2a is a cross-sectional schematic diagram of a prior art interposer decoupling structure.
Figure 2B:
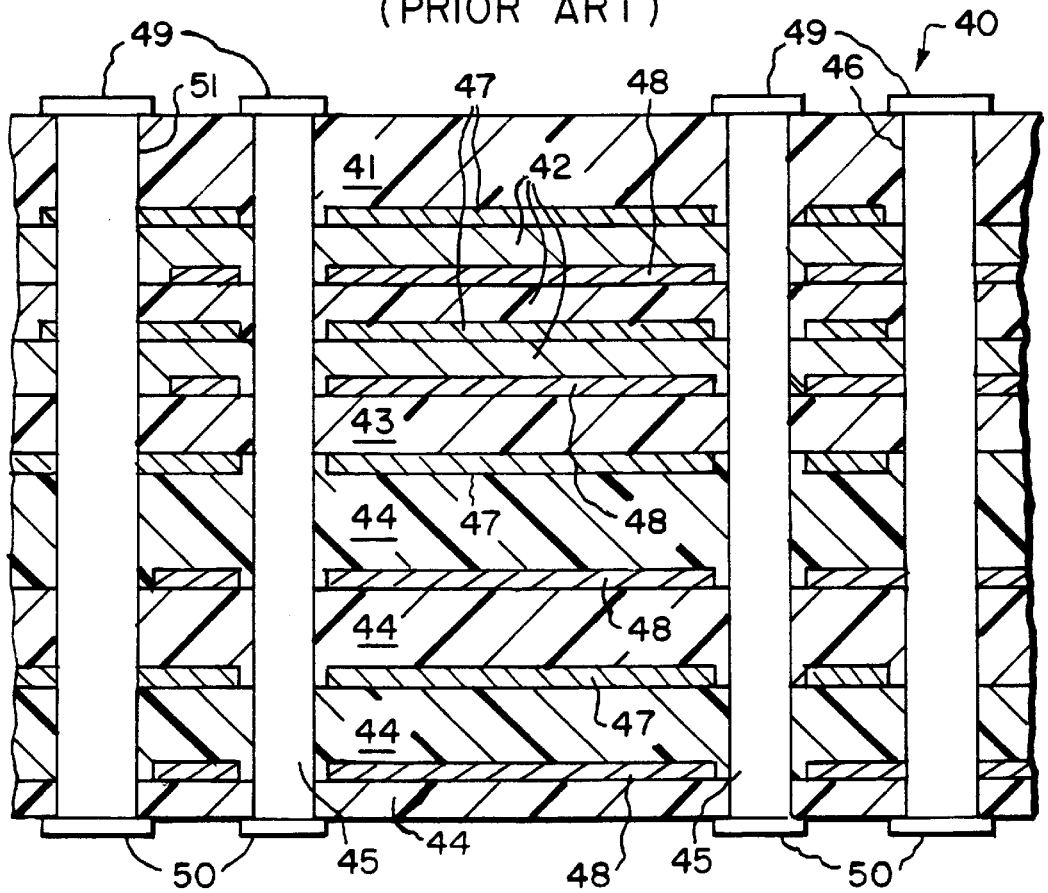
FIG. 2b is a cross-sectional schematic diagram of a prior art capacitor structure integral to a multilayer chip carrier.
Figure 3A:
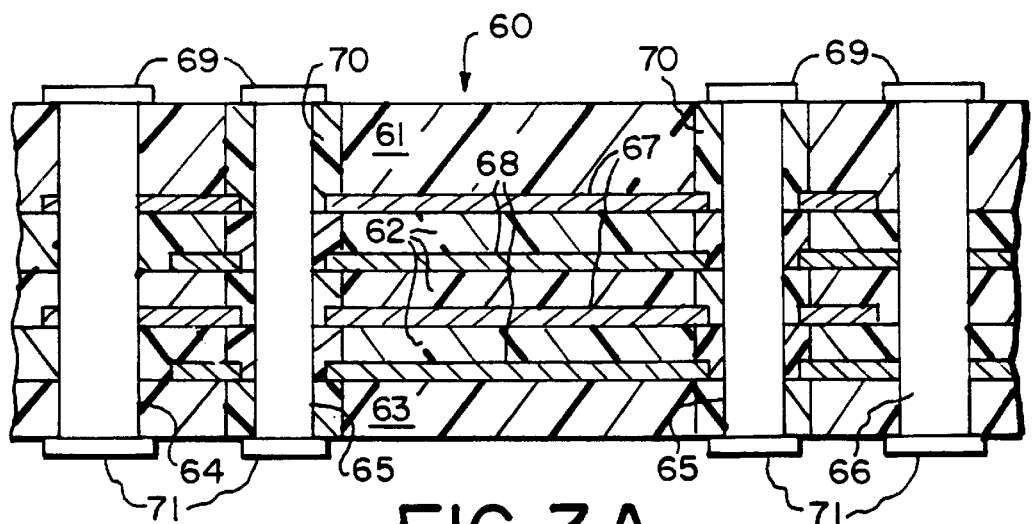
FIG. 3a is a cross-sectional schematic diagram of a low capacitance interposer decoupling structure according to the present invention.

FIG. 3a shows one embodiment 60 of the present invention used as an interposer. FIG. 3a shows a multilayer structure (i.e. using ceramic layers)with dielectric layers 61, 62, 63. A preferred embodiment preferably has layers 62 of high k material to enhance the value of the capacitance between metal electrodes 67 and 68. Passing through this structure are signal vias 65. A key component of this embodiment is that these vias are surrounded by, or sheathed in, a low k material 70. Also passing through the dielectric layers are voltage vias 64 and 66 which are also connected to the electrodes 67 and 68, respectively. To facilitate its use as an interposer, the structure has pads 69 on its top surface to provide connection to a chip which could use for example flip-chip or C4 technology. There are also pads 71 on the bottom surface to facilitate connection to the chip carrier, either a single chip or multi-chip carrier. The use of the high k material provides the capacitance necessary for very high performance electronic chips. However, if the signal vias are in contact with a contiguous layer of high k material then they will have excessively high capacitance and capacitive coupling.

key feature of the present embodiment is the use of a low K material surrounding, or sheathing, the signal vias 65. This sheathing results in significantly lower capacitance of the signal vias and significantly lower coupling between signal vias thus permitting the use of high k layers and thus supporting high performance electronic applications.

Figure 3B:
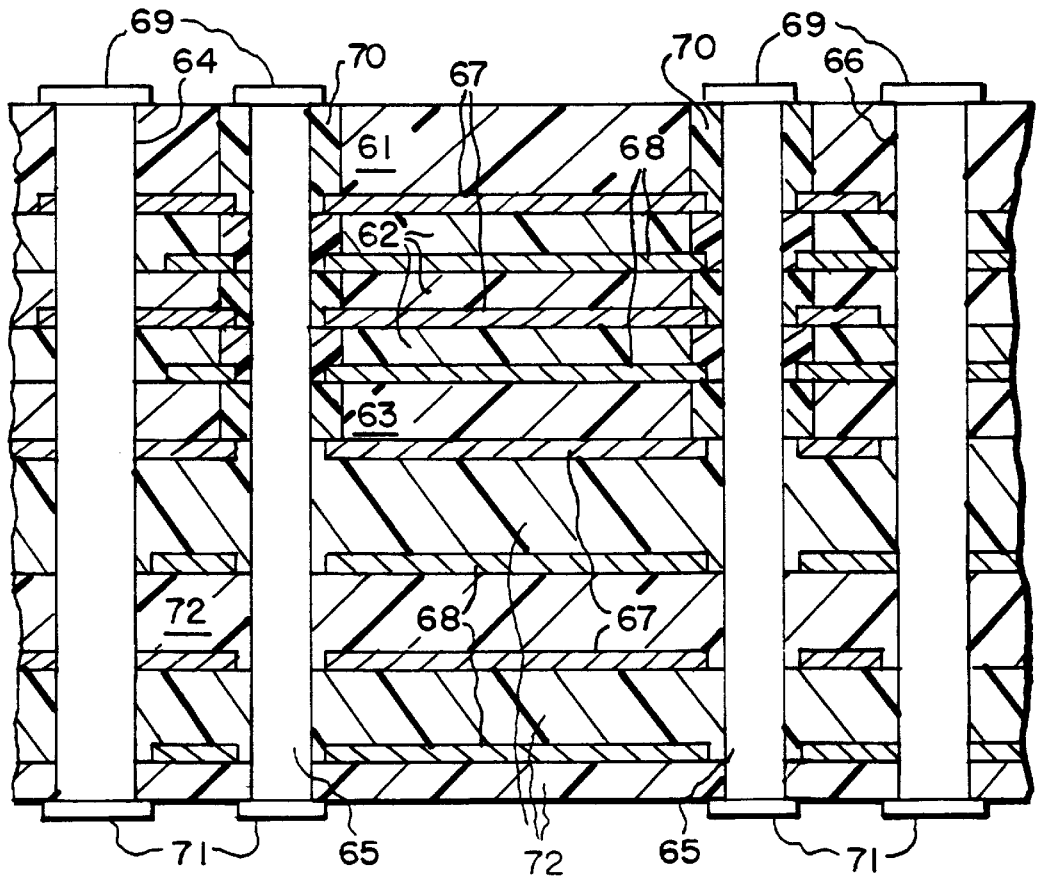
FIG. 3b is a cross-sectional schematic diagram of a reduced signal parasitic capacitance decoupling structure integrated into the top layers of a multilayer chip carrier.

FIG. 3b shows another embodiment of the present invention. FIG. 3b shows the use of this low K sheathing invention in a carrier-integrated structure where the high capacitive layers 61, 62, 63 are on the top of the carrier. Layers 72 are made of a low k material to provide superior signal line characteristics (e.g. time of flight, capacitive loading).

Figure 3C:
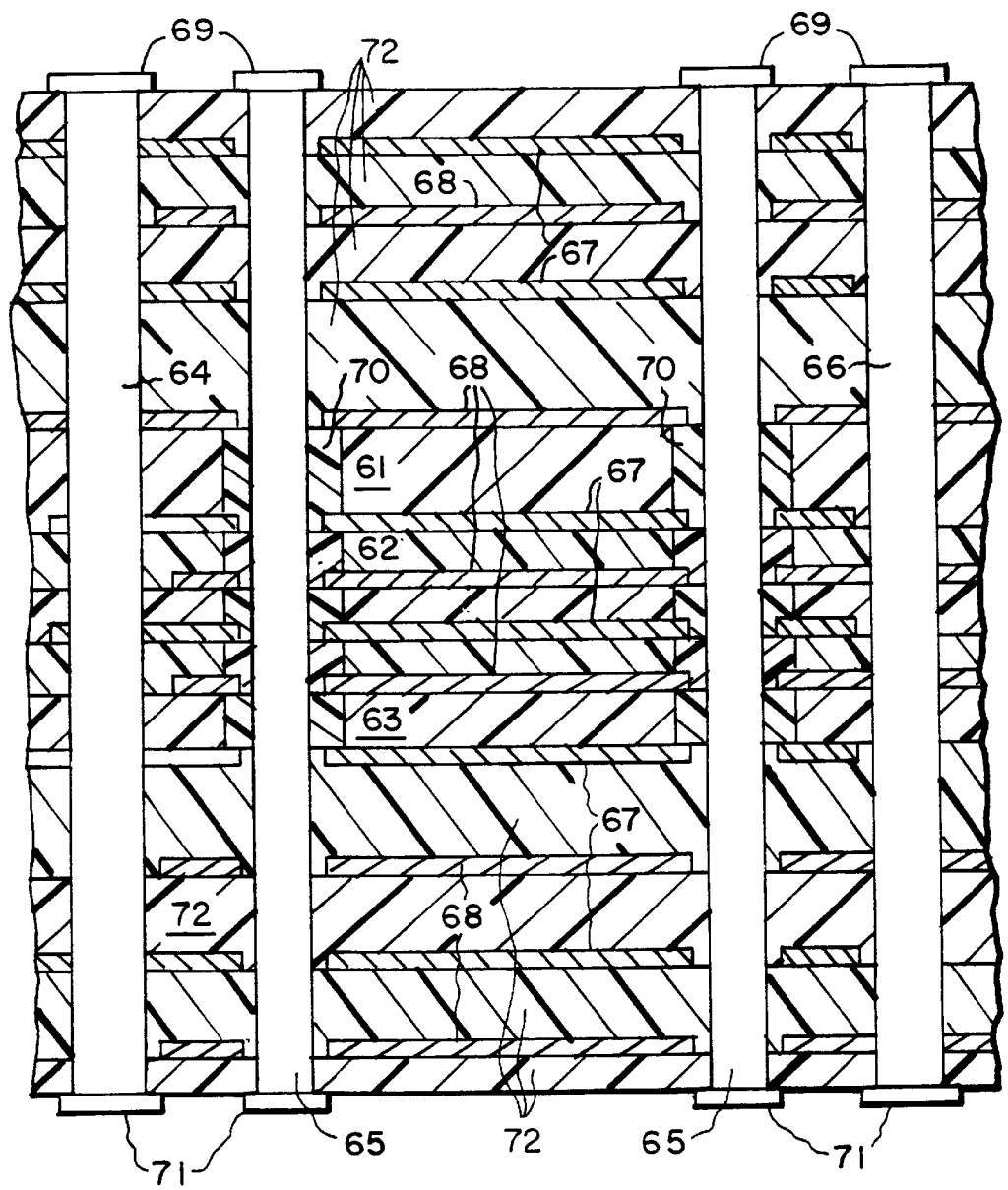
FIG. 3c is a cross-sectional schematic diagram of a reduced signal parasitic capacitance interposer structure integrated into the central portion of a multilayer chip carrier.

FIG. 3c shows the use of this low k sheathing invention in a carrier-integrated structure where the high capacitive layers 61, 62, 63 are within the body of the carrier.

Figure 3D:
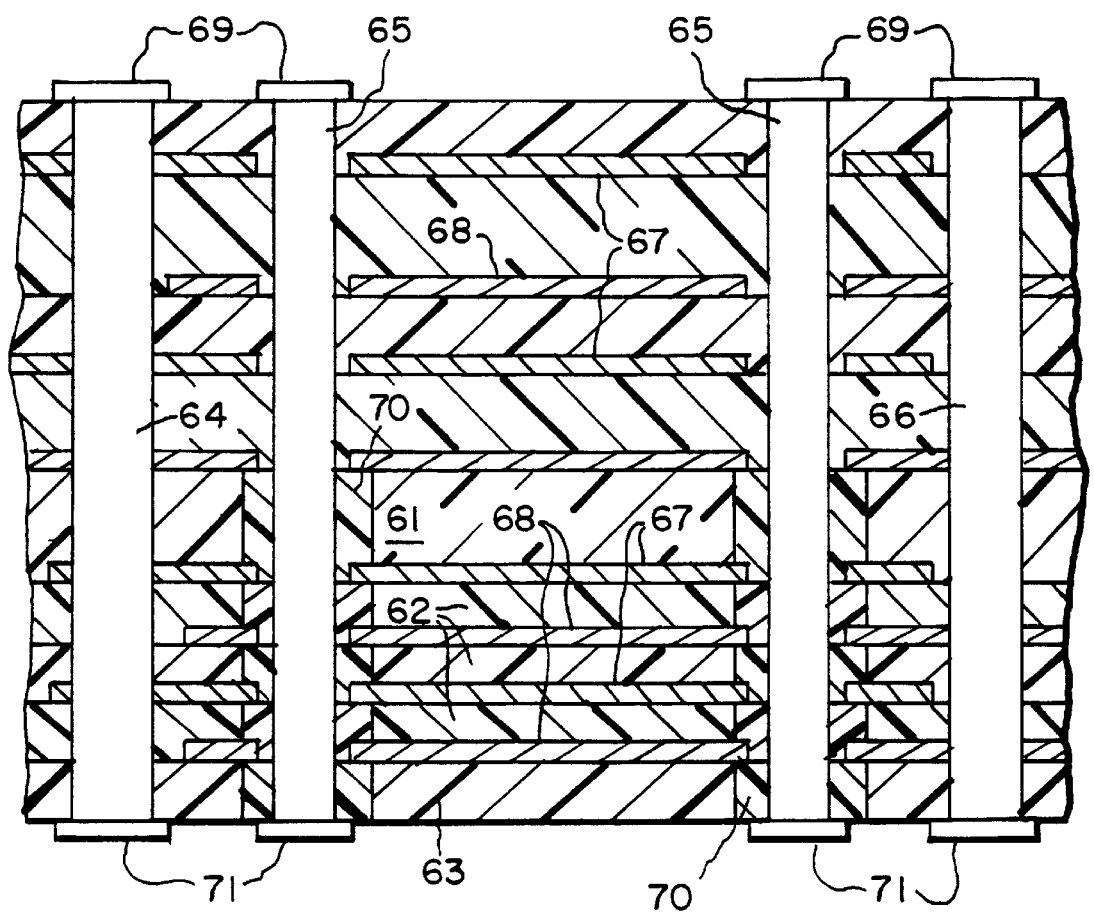
FIG. 3d is a cross-sectional schematic diagram of a reduced signal parasitic capacitance interposer decoupling structure integrated into the bottom of a mutilayer chip carrier.

FIG. 3d shows the use of this low k sheathing invention in a carrier-integrated structure where the high capacitive layers 61, 62, 63 are on the bottom of the carrier.

Figure 3E:
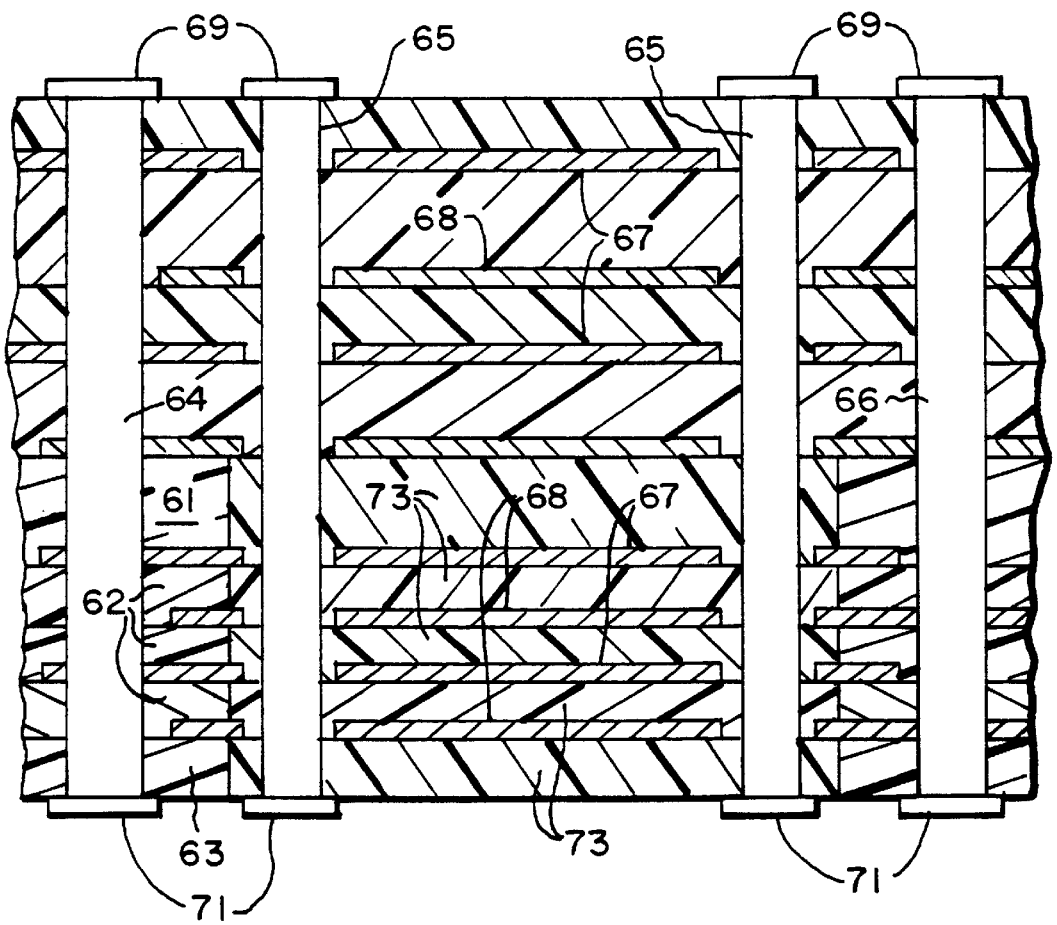
FIG. 3e is a cross-sectional schematic diagram of a reduced signal parasitic capacitance structure integrated as a central zone within a multilayer chip carrier with an additional region of low dielectric constant.

FIG. 3e shows an extension of the signal sheathing approach to include an area or region 73 of low k material where a cluster of signal vias may pass through the high k material layers. The device of FIG. 3e results in a reduced capacitance structure integral with a multilayer chip carrier. A region of low dielectric constant is introduced to permit multiple signals to penetrate the high dielectric constant material thus minimizing the effect on signal traces.

In the device or apparatus of the invention each via is surrounded by a sheath of low k material which prevents the parasitic capacitance problem, while still allowing high k dielectric in the rest of the capacitor to enable delivery of the high decoupling capacitance.

According to another aspect of the invention the device or structure is fabricated by starting with a low k green sheet. At least one via of a selected diameter is formed in the sheet, and then the via(s) is filled with the appropriate metal paste and the sheet is dried. A high k green sheet is then prepared by forming an aperture or apertures in the sheet that is equal in diameter to the diameter of the via(s) and the surrounding area(s) of low dielectric constant material. The filled via low K sheet is placed above the high K sheet with the center line of the via(s) in the low k sheet aligned or co-axial with the center line of the aperture(s) in the high k sheet. A punch having the same diameter as the aperture is placed above the low k sheet with the central axis of the punch aligned co-axially with the center line of the via and the aperture, the punch is activated and a slug is removed from the low k sheet and inserted into the high k sheet. This achieves the transfer of ceramic slugs with metal paste centers from the low k sheet to the high k sheet. The remainder of the process is standard MLC processing, including stacking the high k sheets with the metal/low k centers and laminating and sintering.

FIG. 3a is a schematic drawing of an ideal multilayer ceramic capacitor structure. This structure could be a separate entity such as an interposer capacitor which may then be attached to other components such as chips or chip carriers using flipchip or other means. Alternately, this structure could be part of another structure such as a chip carrier into which it is embedded or integrated.

Described below are two methods to arrive at this final structure.

Method 1

Figure 4A:
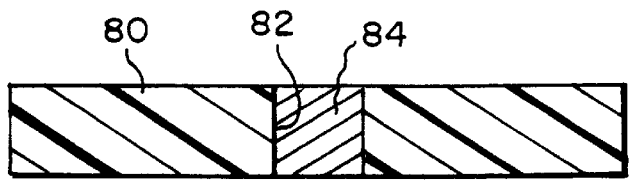
FIGS. 4a through 4d illustrate a method according to the invention used to produce a structure of high dielectric constant material containing a via surrounded by an area of material having a low dielectric constant.

Referring to FIG. 4a a green ceramic sheet 80 (thickness to be determined by final product requirements), has placed therein one or more holes 82 (also known as vias) in it. Green sheet 80 is selected from a material so as to have a low dielectric constant in the ceramic state achieved after it is sintered. The creation of vias 82 may be achieved by punching, laser ablation or other processes. Using metal screening procedures, the vias 82 are filled with an appropriate metal paste 84 which could be a combination of metals (such as tungsten (W), molybdenum (Mo) or other metals or alloys), organic binders and inorganic components (such as silicates or other glass materials, alumina and/or other ceramic materials). This metal paste is formulated or selected to enable cofiring the metal and ceramic green sheet.

Figure 4B:
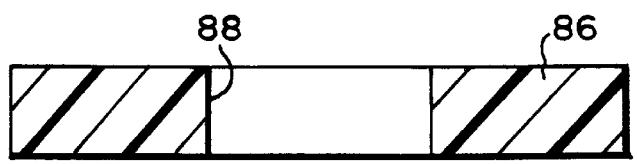

As shown in FIG. 4b another green sheet 86 which upon sintering will yield a ceramic of a relatively high dielectric constant is selected. By using an appropriate process (such as described above), an aperture or apertures (hole or holes) 88 are formed in sheet 86 which are larger in diameter than the holes/vias 82 sheet 80 of low dielectric constant.

Figure 4C:
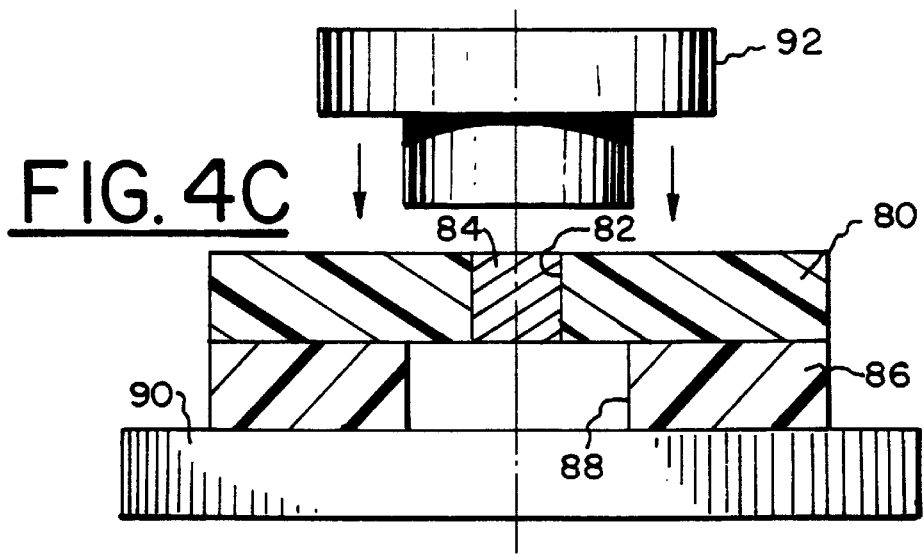

In FIG. 4c green sheet 80 is positioned over green sheet 86 in a manner to superimpose the filled via(s) 82 over the larger unfilled via(s) 88. Care should be taken to align the via(s) 82 and the aperture(s) 88 so that their longitudinal axes are as close to co-axial as is possible. This alignment is achieved by use of fiducial and other alignment marks on the green sheet which is a practice well-known in the industry. The entire assembly is placed on a platten or table 90.

Figure 4D:
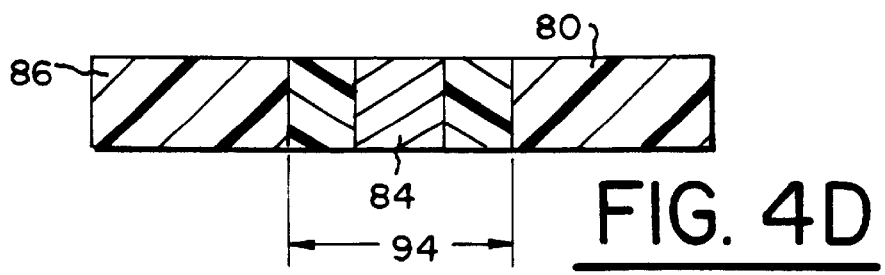

Using a punching device 92, or other means, the filled green sheet 80 should then be used to create a slug 94 (FIG. 4d), which separates from sheet 80 and is inserted in the via 88 of the sheet 86 below. Punch 92 is aligned with its longitudinal axis as close to co-axial with the longitudinal axes of the via 82 of sheet 80 and aperture 88 of sheet 86. After co-sintering one or several sheets 86, a final ceramic structure is achieved in which the metal conductor formed from metal paste 84 is surrounded by the low dielectric constant ceramic formed from green sheet 21. This is further surrounded by the high dielectric constant ceramic formed from green sheet 86. This represents the ideal capacitor structure shown in FIG. 3a where signal transmission occurs in metal regions surrounded by low dielectric sheaths.

Method 2

Figure 5A:
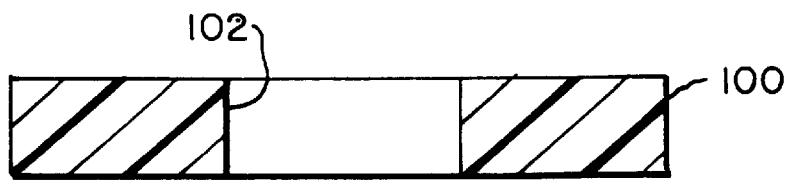
FIGS. 5a through 5d illustrate second and third alternate methods according to the invention to produce a structure of high dielectric constant material containing a Via surrounded by an area of material having a low dielectric constant.

Referring to FIG. 5a a green ceramic sheet 100 is selected so that upon sintering, it will yield a final ceramic material of a relatively high dielectric constant. Using a punch or other means, a via or vias 102 are formed sheet 100.

Figure 5B:
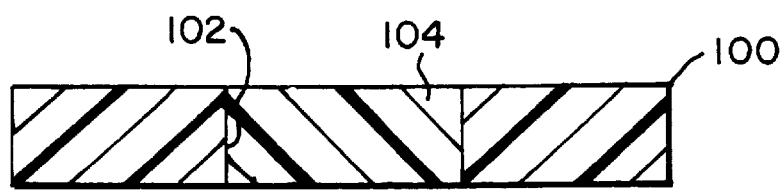

Next as shown in FIG. 5b a dielectric paste 104 consisting of the appropriate ceramic materials and organic and glass mixtures to yield a low dielectric constant ceramic upon sintering at the right conditions is selected. Using screening or any other appropriate method, the via 102 is filled with the dielectric paste 104 and the paste is allowed to dry to achieve some measure of strength.

Figure 5C:
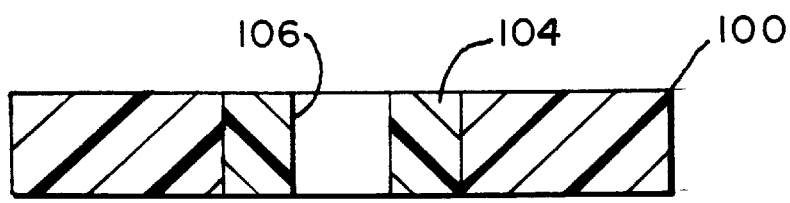

FIG. 5c illustrates using a punch or other appropriate method, to create via or vias 106 in sheet 100 such that the central axis of the newly created via 106 is as close as possible to co-axial with the longitudinal axis of the previously created and filled via 102. The new via 106 must be smaller in diameter than via 102. The actual diameters of the two vias (102, 106) may be determined by several factors such as thickness of the green sheet 100, physical properties of the green sheet 100, physical properties of the dielectric paste 104, electrical requirements placed on the conductor lines to be formed within the via 106, and other factors.

Figure 5D:
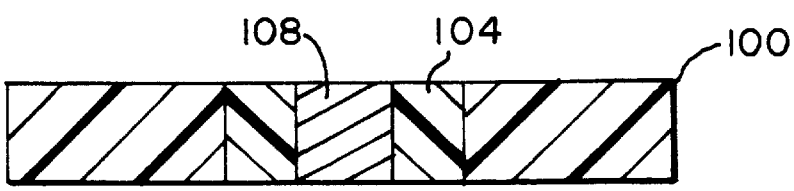

Referring to FIG. 5d, using screening or other appropriate methods, the via 72 is filled with a suitable metal paste 108 which consists of a combination of metal powder, ceramic and glass powders and organic binders. After sintering one or several layers of this structure, the final structure will be like that represented by FIG. 3a, the ideal capacitor structure. This structure will have signal transmissions occurring in areas surrounded by low dielectric sheathing to minimize noise implications.

Method 3

Referring to FIG. 5a a green ceramic sheet 100 is selected so that upon sintering it will yield a final ceramic material of a relatively high dielectric constant. Using a punch or other means, a via or vias 102 are formed or created in sheet 100.

Next referring again to FIG. 5b a dielectric paste of the appropriate viscosity made of ceramic, organic and glass mixtures to yield a low dielectric constant ceramic upon sintering at the right conditions is selected. Using screening or any other method, the via 100 is filled with the dielectric paste 104.

FIG. 5c illustrates that by using appropriate solvent reducing conditions, the dielectric paste 104 of appropriate viscosity is then allowed to shrink under the influence of temperature, gas flow, time or any combination thereof. This would leave an open central space within the paste 104, to create co-axial via 104.

Referring again to FIG. 5d using screening or any other appropriate method, the via 106 is filled with a suitable metal paste 108 which consists of a combination of metal powder, ceramic and glass powders and organic binders. After sintering one or several layers of this structure, the final structure will be that represented by FIG. 3a, the ideal capacitor structure. This structure will have signal transmissions occurring in areas surrounded by low dielectric sheathing to minimize noise implications.

Method 4

FIG. 6a shows a sintered ceramic structure 110, such as a multilayer ceramic structure. The ceramic 112 may consist of one or more sheets of ceramic which are cofired with metal paste to form metal conductors 114, 116, 118 in the multilayer structure. Typically ceramic 112 is a low dielectric constant ceramic, 114 is a power transmission also referred to as a power via, 116 is a signal transmission or via and 118 is a ground transmission or via.

The capacitor structure is then built on top of the fired structure. Such an embodiment is also referred to as a post-fire capacitor.

Referring to FIG. 6b a metal electrode 120 is then deposited and patterned using appropriate materials and patterning techniques as are well known in the art. Since 120 represents the ground electrode, electrode 120 is electrically shorted to ground through via 118 but should be electrically isolated from power via 114 and signal via 116. For example, a metal may be deposited using thick film processes such as metal paste screening through a screening mask, or thin film processes such as sputter deposition or evaporation, followed by photolithography and wet or dry etch methods to arrive at the final pattern. Similarly a relatively high dielectric material 122 is then deposited and patterned using either thick film process methods such as screening appropriate precursor pastes, or thin film processes such as sputter deposition or chemical vapor deposition, followed by patterning using photo lithography and wet or dry etching to achieve the desired pattern.

Referring now to FIG. 6c, using a thick or thin film process, a relatively low dielectric constant material is then deposited within the empty regions to create doughnut shaped sheaths 124, 125 around the central axes of vias 114 and 116. These sheaths 124, 125 should be formed so as to leave sufficient clearance or a passage in the center for subsequent metal filling.

As shown FIG. 6d layer 126 which is also an electrode layer is deposited and patterned similar to layer 120, except that layer 126 should be electrically isolated from 116 and 118, and electrically shorted to 114. Further it should be connected to 114 by filling the central gap within 124 by the same metal used in layer 126.

Layer 128 is a low dielectric constant layer which is then deposited and patterned similar to layer 124. Layer 130 is a metal conductor layer which is then deposited and patterned as shown.

In the case of thick film ceramic pastes (or green sheets) 122, 124, 128 and metal pastes 120, 126, 130, a sintering process is required to cofire the structure after deposition. In case of thin film methods used for deposition, this requirement does not exist.

This invention can be used for interposers, discrete or integrated decaps.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A method for producing a metal via surrounded by a material of low dielectric constant, the via and the low dielectric constant material embedded in a material having a high dielectric constant comprising the steps of:

a) forming at least one via having a predetermined diameter in a green sheet material having a low dielectric constant;

b) filling said via with a selected metal paste and drying said sheet;

c) selecting a second green sheet of a material having a high dielectric constant and forming at least one aperture therein, said aperture having a diameter equal to the desired diameter of said via surrounded by said material having a low dielectric constant; .

d) placing said sheet of low dielectric constant material above said material having a high dielectric constant and aligning a center line of said via with a center line of said aperture; and punching through said sheet of low dielectric constant material with a punch equal to or less than the diameter of said aperture, said punch having a central axis aligned with a central axis of said via and said aperture to create a plug of low dielectric constant material containing said via inserted into said aperture in said high dielectric constant material.

2. A method according to claim 1 including producing several sheets of high dielectric constant material containing inserted vias surrounded by low dielectric constant material.

3. A method according to claim 2 including stacking said sheets of high dielectric constant material containing vias surrounded by low dielectric constant material to produce a multilayer structure with vias disposed to produce a continuous path from a top layer to a bottom layer of said structure, wherein each layer is formed from a separate sheet of said high dielectric constant material containing vias surrounded by low dielectric constant material.

4. A method according to claim 3 wherein said layers are laminated together.

5. A method according to claim 4 wherein said laminated structure is sintered.

6. A method according to claim 3 including covering said stacked layers with at least one layer of a material having a high dielectric constant.

7. A method according to claim 3 including using said stacked layers to form a composite wherein said stacked layers are inside a composite of layers of a material having a high dielectric constant to form a further multilayer structure.

8. A method according to claim 3 including using said stacked layers on top of a material having a high dielectric constant to form a further multilayer structure.

* * * * *

UNITED STATES PATENT AND TRADEMARK OFFICE
CERTIFICATE OF CORRECTION

PATENT NO. : 6,200,400 B1
DATED : March 13, 2001
INVENTOR(S) : Mukta S. Farooq et al.

It is certified that error appears in the above-identified patent and that said Letters Patent is hereby corrected as shown below:

<u>Column 5,</u>
Line 30, before "key feature", insert -- A --.

Signed and Sealed this

Fifth Day of February, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,200,400 B1
DATED : March 13, 2001
INVENTOR(S) : Mukta S. Farooq et al.

It is certified that error appears in the above-identified patent and that said Letters Patent is hereby corrected as shown below:

<u>Title page,</u>
Item [73], delete "Corp." and insert -- Corporation --;

Signed and Sealed this

Eleventh Day of June, 2002

Attest:

JAMES E. ROGAN
Attesting Officer    Director of the United States Patent and Trademark Office